United States Patent

[11] 3,571,621

[72] Inventors Clifton W. Hart
Diamond Bar, Calif.;
Eugene E. Rosacker, Richfield, Minn.

[21] Appl. No. 747,713
[22] Filed July 25, 1968
[45] Patented Mar. 23, 1971
[73] Assignee The United States of America as represented by the Secretary of the Air Force

[54] SIGNAL SELECTING CIRCUIT
3 Claims, 1 Drawing Fig.

[52] U.S. Cl. .......... 307/235, 307/236, 307/262, 307/313
[51] Int. Cl. .......... H03k 5/20, H03k 5/00
[50] Field of Search .......... 307/235, 236, 262, 313; 328/115, 26

[56] References Cited

UNITED STATES PATENTS

| | | | |
|---|---|---|---|
| 2,822,474 | 2/1958 | Boecker .......... | 328/135X |
| 3,289,007 | 11/1966 | Zydney .......... | 328/26X |
| 3,426,245 | 2/1969 | Yurasek et al. .......... | 307/313X |

*Primary Examiner*—Donald D. Forrer
*Assistant Examiner*—John Zazworsky
*Attorneys*—Harry A. Herbert, Jr. and John J. Mulrooney

ABSTRACT: A circuit detects and produces an output whenever a signal of either positive or negative polarity exceeds a predetermined value. The determinative characteristic of the selected (output producing) signal is the amplitude; the duration and shape have little influence upon the production of an output.

PATENTED MAR 23 1971 3,571,621
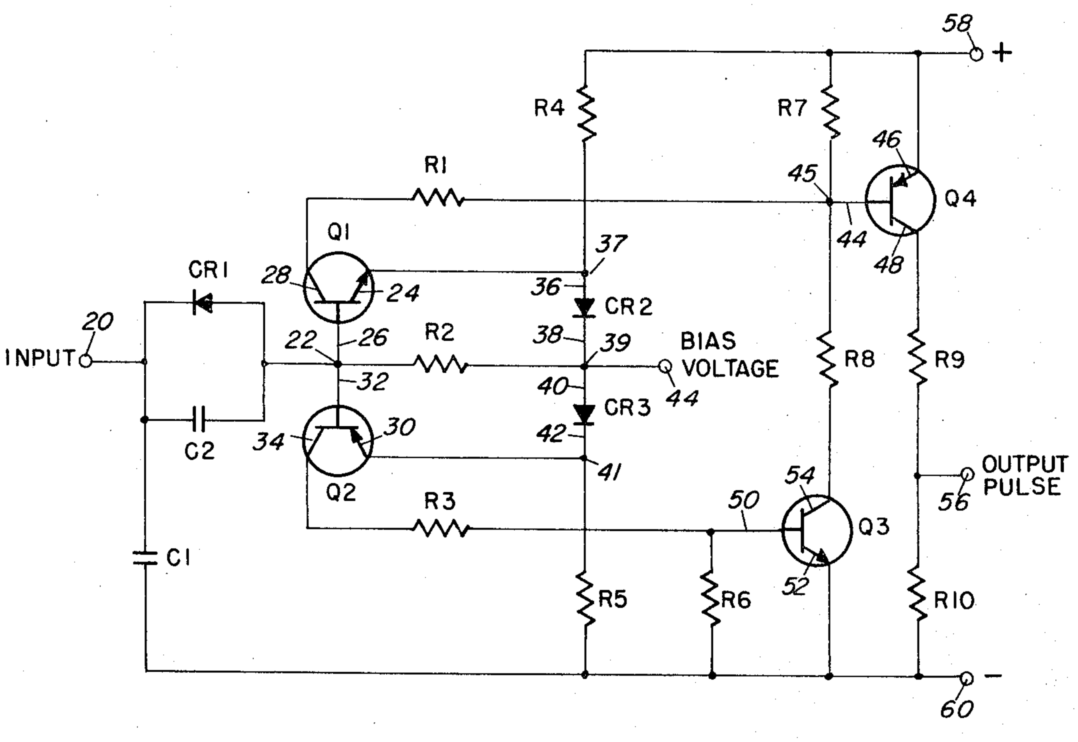
INVENTORS
CLIFTON W. HART
EUGENE E. ROSACKER
BY Harry A. Herbert Jr. and
ATTORNEYS

SIGNAL SELECTING CIRCUIT

BACKGROUND OF THE INVENTION

1. Field of the Invention

The present invention pertains generally to solid state device circuits and in particular to a semiconductor signal amplitude detector circuit which selects or detects signals with respect to their amplitude and produces an output indicative of such a selection.

2. Description of the Prior Art

Prior art circuits for detecting signal amplitudes have generally been the above or below normal voltage detectors used in process controls. These have tended to be multi-component, complex systems. The circuit of the present invention utilizes a minimum of components to perform the function of selecting certain signals having amplitudes greater than a predetermined value. Furthermore, power dissipation is limited to semiconductor junction leakage because all but a minimum number of the semiconductors are normally in the biased-off condition.

BRIEF SUMMARY OF THE INVENTION

The signal amplitude detector of the present invention comprises essentially a pair of complimentary transistors which have a common input connected to their bases, said bases being staticly biased to the nonconducting state. An input signal of either positive or negative polarity which exceeds the detector's predetermined threshold value will cause one of the two transistors to conduct and thereby produce an output signal.

BRIEF DESCRIPTION OF THE DRAWINGS

The drawing is a schematic circuit diagram of the signal amplitude detector of this invention.

DESCRIPTION OF THE PREFERRED EMBODIMENT

Referring to the drawing, the signal amplitude detector of the present invention comprises a pair of complimentary transistors, Q1 and Q2. NPN transistor Q1 has an emitter 24, a base 26 and a collector 28. PNP transistor Q2 has an emitter 30, a base 32 and a collector 34. The bases 26 and 32 of transistors Q1 and Q2 respectively are connected at junction 22. Input terminal 20 is connected to junction 22 through the parallel combination of diode CR1 and C2. Also, input terminal 20 is connected through bypass capacitor C1 to the negative terminal 60 of the circuit power supply.

The emitter of transistor Q1 is connected at junction 37 to the anode 36 of a diode CR2. Junction 37 is connected through resistor R4 to the (+) terminal 58 of the circuit power supply. The cathode 38 of diode CR2 is connected through resistor R2 to the bases 26 and 32 of transistors Q1 and Q2. The emitter 30 of transistor Q2 is connected at junction 41 to the cathode 42 of diode CR 3. Junction 41 is connected through resistor R5 to the (−) terminal 60 of the circuit power supply. The anode 40 of diode CR2 is connected at junction 39 to the cathode 38 of diode CR2. Also connected to junction 39 is a source of bias voltage 44.

The collector 28 of transistor Q1 is connected through resistor R1 to junction 45; junction 45 is also connected to the base 44 of PNP transistor Q4 and, through resistor R7, to the positive terminal 58 of the circuit power supply. The emitter 46 of transistor Q4 is connected directly to circuit power supply terminal 58. The collector 48 of transistor Q4 is connected through a series arrangement of resistors R9 and R10 to the negative terminal 60 of the circuit power supply. Output terminal 56 is connected between voltage dividing resistors R9 and R10. The collector 34 of transistor Q2 is connected through resistor R3 to the base 50 of NPN transistor Q3; base 50 is also connected to the negative terminal 60 of the circuit power supply through resistor R6. Collector 54 of transistor Q3 is connected to junction 45 through resistor R8 and emitter 52 is connected directly to negative terminal 60 of the circuit power supply.

The threshold voltage of the amplitude detector is directly influenced by the values of R2, R4, and R5, the circuit power supply voltage at 58, 60 and the bias voltage applied at terminal 44 and the characteristics of Q1, Q2, CR2 and CR3. Variation of any one of the values or parameters will alter the threshold voltage of the detector. Under normal bias conditions, the bias voltage applied at terminal 44 and the circuit power supply voltage applied at 58, 60 are chosen so that transistors Q1, Q2, Q3 and Q4 are in a biased-off condition. In this condition, the circuit power dissipation is limited to junction leakage dissipation in the transistors and the bias power dissipation in resistors R4 and R5 caused by the bias current which flows from circuit power supply terminal 58 through R4, CR2, CR3 and R5 to circuit power supply terminal 60.

In operation the bias current which flows through diodes CR2 and CR3, in combination with the bias voltage at terminal 44, establish nonconducting bias conditions in the emitter-base circuits of transistors Q1 and Q2. Assuming that a positive going input signal which equals or exceeds the selecting circuit's threshold value is applied at terminal 20, a positive voltage will be coupled through capacitor C2 and will appear across dropping resistor R2. The input circuit consists of terminal 20, capacitor C2, resistor R2 and terminal 44. The dropping of this positive voltage across R2 raises the voltage of junction 22 with respect to the voltage at junction 39 to sufficiently forward bias the emitter-base junction of transistor Q1 to put it into a conducting state. Conduction of transistor Q1 will cause current to be drawn from the terminal 58 of the circuit power supply via R7 and R1. Current flow through R7 from terminal 58 to junction 45 will forward bias the emitter-base junction of transistor Q4 and will initiate conduction in Q4. The collector output of transistor Q4 will produce a positive going output pulse across resistor R10 which can be sensed and fed to any chosen utilization circuit (not shown) connected to terminal 56. Assuming that a negative going input signal which equals or exceeds the selecting circuit's threshold value is applied at terminal 20, a negative signal will be coupled through capacitor C2 and will be dropped across dropping resistor R2. The input circuit consists of terminal 20, capacitor C2, resistor R2 and terminal 44. Diode CR1 limits the reverse voltage across capacitor C2. The dropping of the negative signal across R2 raises the voltage at junction 39 with respect to the voltage at junction 22 to forward bias the emitter-base junction of transistor Q2 to put it into a conducting state. Collector output of transistor Q2 will be applied to the base 50 of transistor Q3 thereby initiating conduction in Q3. Conduction in Q3 will cause a negative pulse to be applied at base 44 of transistor Q4 to initiate conduction in Q4. Again the collector output of transistor Q4 will produce a positive going output pulse across resistor R10 which can be sensed and fed to any chosen utilization circuit (not shown) connected to terminal 56.

The signal selecting circuit disclosed will produce an output of positive polarity for an input of either positive or negative polarity which equals or exceeds the circuit's threshold value. The positive and negative threshold levels will be primarily based on the emitter-base characteristics of transistors Q1 and Q2 and on the characteristics of CR2 and CR3. If both emitter-base characteristics and both diode characteristics are matched, a symmetrical threshold level can be achieved. If these characteristics are not matched, then the circuit may have different positive and negative signal threshold levels. Power consumption in this circuit is low due to the biased-off condition of all the transistors.

Although the invention has been described with reference to a particular embodiment, it will be understood to those skilled in the art that the invention is capable of a variety of alternative embodiments within the spirit and scope of the appended claims.

I claim:

1. A signal selecting circuit for producing an output pulse whenever a signal of either positive or negative polarity exceeds a threshold level comprising:

a. circuit input means;

b. first transistor means having emitter, base and collector terminals;

c. second transistor means having emitter, base and collector terminals;

d. junction means for interconnecting said circuit input means with the base terminals of said first and second transistor means;

e. first diode means connected in the emitter-base circuit of said first transistor means;

f. second diode means connected in the emitter-base circuit of said second transistor means;

g. circuit power supply means having positive and negative terminals for producing a bias current through said first and second diode means to bias said first and second transistor means in a normally nonconducting state;

h. third transistor means having emitter, base and collector terminals;

i. fourth transistor means having emitter, base and collector terminals;

j. means for connecting said second transistor collector terminal to said third transistor base terminal;

k. means for connecting said first transistor means collector terminal and said third transistor means collector terminal to said fourth transistor means base terminal;

l. means for connecting said emitter terminal and said base terminal of said fourth transistor means to said circuit power supply positive terminal;

m. means for connecting said emitter terminal and said base terminal of said third transistor means to said circuit power supply negative terminal;

n. and means including an output resistor for connecting said fourth transistor means collector terminal to said circuit power supply negative terminal whereby a positive or negative going input signal which exceeds the selector circuit threshold voltage will produce a positive going output signal across said output resistor.

2. A signal selecting circuit as recited in claim 1 wherein said first and said third transistor means are NPN-type transistors and said second and said fourth transistor means are PNP-type transistors.

3. A signal selecting circuit for producing a positive going output signal whenever an input signal of either positive or negative polarity exceeds a predetermined value comprising:

a. a pair of complimentary transistors, each having an emitter, collector and base, said bases having a common input connection;

b. diode means connected between said common input connection and the emitters of said transistors;

c. circuit bias means for producing a bias current in said diode means to bias said complimentary transistors in a nonconducting state;

d. output transistor means connected to the collectors of said complimentary transistors so that whenever a positive or negative going input signal which exceeds a predetermined value is coupled to said common input connection, one of said complimentary transistors will conduct and thereby initiate conduction in said output transistor means to produce a positive going output signal.